(12) United States Patent
Srividya et al.

(10) Patent No.: US 7,687,844 B2
(45) Date of Patent: *Mar. 30, 2010

(54) SEMICONDUCTOR CONSTRUCTIONS

(75) Inventors: Cancheepuram V. Srividya, Boise, ID (US); F. Daniel Gealy, Kuna, ID (US); Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/052,124

(22) Filed: Mar. 20, 2008

(65) Prior Publication Data

US 2008/0166572 A1 Jul. 10, 2008

Related U.S. Application Data

(60) Division of application No. 11/591,254, filed on Oct. 31, 2006, now Pat. No. 7,372,094, which is a continuation of application No. 11/015,689, filed on Dec. 17, 2004, now Pat. No. 7,141,847, which is a continuation of application No. 10/773,780, filed on Feb. 9, 2004, now Pat. No. 6,858,894, which is a division of application No. 10/231,789, filed on Aug. 29, 2002, now Pat. No. 6,773,984.

(51) Int. Cl.
 *H01L 27/108* (2006.01)
(52) U.S. Cl. ..................................................... 257/309

(58) Field of Classification Search ...................... None
See application file for complete search history.

(56) References Cited

U.S. PATENT DOCUMENTS

| 3,653,947 | A | | 4/1972 | Kandler et al. | |
|---|---|---|---|---|---|
| 6,022,775 | A | * | 2/2000 | Tsai et al. | 438/253 |
| 6,518,198 | B1 | | 2/2003 | Klein | |
| 6,727,540 | B2 | | 4/2004 | Divakaruni et al. | |
| 6,794,704 | B2 | * | 9/2004 | Yates et al. | 257/309 |
| 6,858,894 | B2 | * | 2/2005 | Srividya et al. | 257/309 |
| 6,900,119 | B2 | * | 5/2005 | Hu | 438/627 |
| 7,141,847 | B2 | * | 11/2006 | Srividya et al. | 257/309 |
| 2003/0020122 | A1 | * | 1/2003 | Joo et al. | 257/381 |
| 2003/0042526 | A1 | * | 3/2003 | Weimer | 257/309 |
| 2003/0203508 | A1 | * | 10/2003 | Yates et al. | 438/1 |
| 2004/0071879 | A1 | | 4/2004 | Callegari et al. | |

\* cited by examiner

*Primary Examiner*—Thao P. Le
(74) *Attorney, Agent, or Firm*—Wells St. John P.S.

(57) ABSTRACT

The invention includes a method of depositing a noble metal. A substrate is provided. The substrate has a first region and a second region. The first and second regions are exposed to a mixture comprising a precursor of a noble metal and an oxidant. During the exposure, a layer containing the noble metal is selectively deposited onto the first region relative to the second region. In particular applications, the first region can comprise borophosphosilicate glass, and the second region can comprise either aluminum oxide or doped non-oxidized silicon. The invention also includes capacitor constructions and methods of forming capacitor constructions.

4 Claims, 4 Drawing Sheets

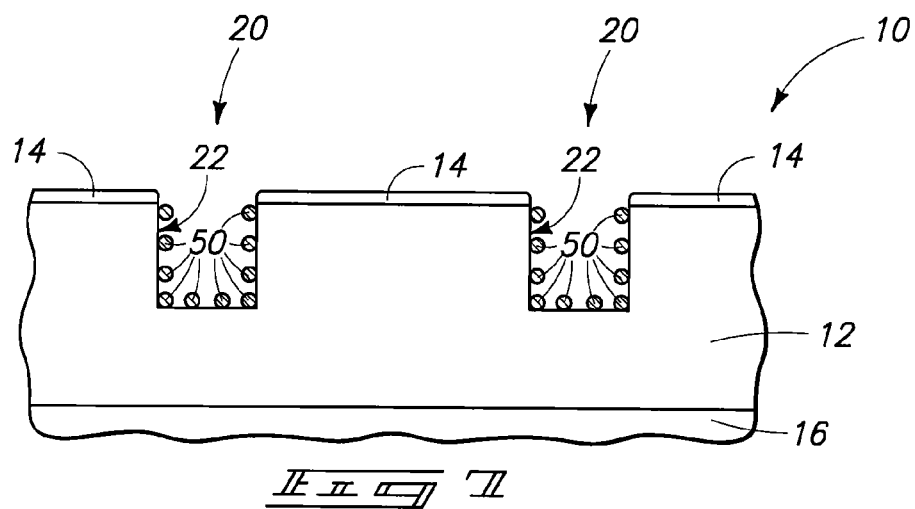
_Fig. 7_
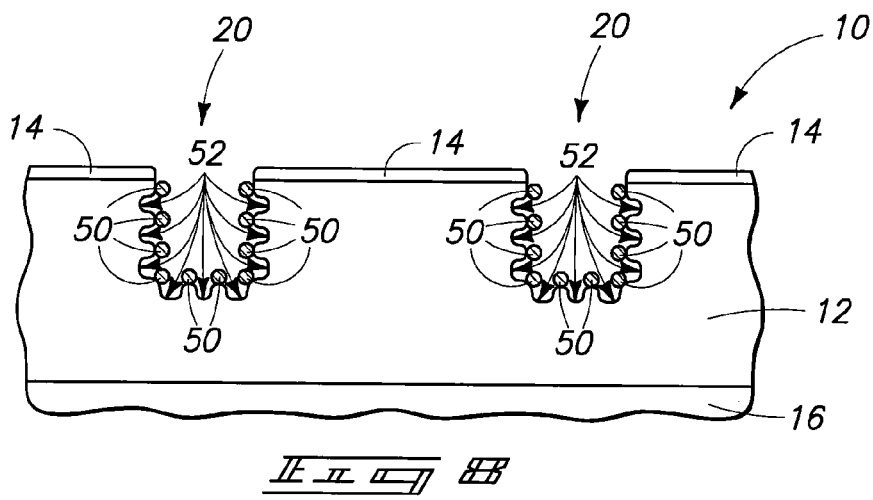
_Fig. 8_
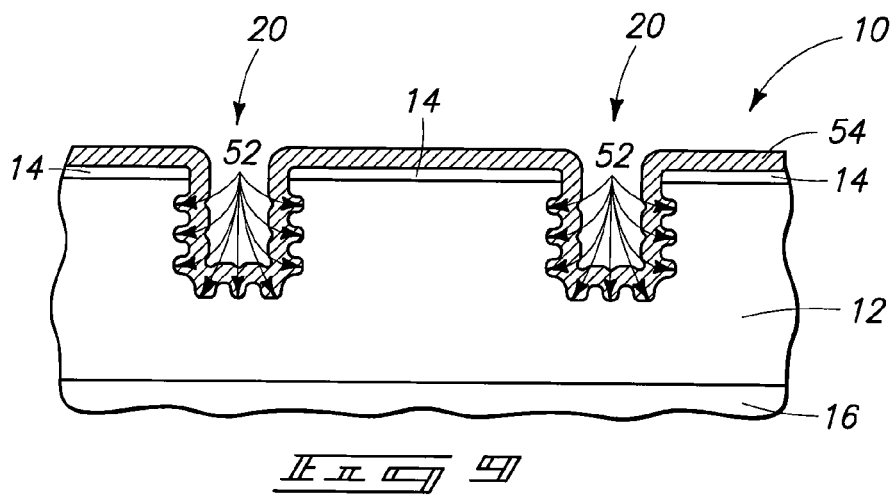
_Fig. 9_

SEMICONDUCTOR CONSTRUCTIONS

RELATED PATENT DATA

This patent resulted from a divisional application of U.S. patent application Ser. No. 11/591,254 which was filed Oct. 31, 2006, and hereby incorporated herein by reference; which in turn resulted from a continuation application of U.S. patent application Ser. No. 11/015,689 which was filed Dec. 17, 2004, and hereby incorporated herein by reference; which in turn resulted from a continuation application of U.S. patent application Ser. No. 10/773,780 which was filed Feb. 9, 2004, now U.S. Pat. No. 6,858,894, and hereby incorporated herein by reference; which in turn resulted from a divisional application of U.S. patent application Ser. No. 10/231,789, which was filed Aug. 29, 2002, now U.S. Pat. No. 6,773,984, and hereby incorporated herein by reference.

TECHNICAL FIELD

The invention pertains to methods of depositing noble metals. The invention also pertains to methods of forming capacitor constructions, as well as to the capacitor constructions themselves.

BACKGROUND OF THE INVENTION

Capacitors are utilized in numerous semiconductor constructions, including, for example, dynamic random access memory (DRAM) devices. Capacitors comprise a pair of electrically conductive materials (frequently referred to as a storage node and a capacitor plate) which are separated from one another by dielectric material. The conductive materials are thus capacitively coupled with one another.

Various materials have been utilized for the conductive components of capacitor constructions, including, for example, metals, metal silicides, metal nitrides and conductively-doped semiconductor materials (such as, for example, conductively-doped silicon). Materials that can be particularly useful in capacitor constructions are so-called noble metals, which include, for example, platinum, rhodium, iridium, palladium and ruthenium. A difficulty in utilizing the noble metals is in patterning constructions from the metals. For instance, if platinum is utilized to form a conductive component of a capacitor construction, it can be difficult to pattern the platinum into a desired shape.

One of the methods that is frequently utilized for patterning platinum is chemical-mechanical polishing. However, such method can smear platinum. The smearing can cause undesirable defect structures.

It would be desirable to develop new methods of forming noble metals into desired shapes for semiconductor applications, and it would be particularly desirable if such new methods could be applied to fabrication of capacitor structures.

Although the invention was motivated by the applications discussed above, it is to be understood that the invention is not limited to such applications except to the extent that the applications are explicitly recited in the claims which follow.

SUMMARY OF THE INVENTION

In one aspect, the invention encompasses a method of depositing at least one noble metal. A substrate is provided. The substrate includes first and second materials, with the first material being different than the second material. The first and second materials are exposed to a mixture comprising at least one precursor of at least one noble metal and at least one oxidant. During the exposure to the mixture, a layer containing at least one noble metal is selectively deposited onto the first material relative to the second material. In particular applications, the first material can comprise borophosphosilicate glass, and the second material can comprise either aluminum oxide or doped non-oxidized silicon.

In one aspect, the invention encompasses a method of forming a capacitor construction. A substrate is provided, and a first material is formed over the substrate. A second material is formed over the first material. Openings are formed to extend through the second material and into the first material. After the openings are formed, regions of the first and second materials are exposed to a mixture containing at least one precursor of at least one noble metal and at least one oxidant. A first layer comprising at least one noble metal is selectively deposited onto the first material relative to the second material as the materials are exposed to the mixture. The first layer is then exposed to conditions which roughen it. An electrically conductive second layer is formed over the roughened first layer, a dielectric third layer is formed over the second layer, and an electrically conductive fourth layer is formed over the third layer.

BRIEF DESCRIPTION OF THE DRAWINGS

Preferred embodiments of the invention are described below with reference to the following accompanying drawings.

FIG. 7 is a view of the FIG. 1 fragment shown at a processing stage subsequent to that of FIG. 4 in accordance with another aspect of the invention.

FIG. 8 is a view of the FIG. 7 fragment shown at a processing stage subsequent to that of FIG. 7.

FIG. 9 is a view of the FIG. 7 fragment shown at a processing stage subsequent to that of FIG. 8.

DETAILED DESCRIPTION OF THE PREFERRED EMBODIMENTS

One aspect of the invention is a recognition that deposition of platinum and other noble metals can be substrate dependent under appropriate processing conditions. Specifically, it is found that noble metals can be preferentially deposited on either borophosphosilicate glass (BPSG) or tantalum oxide substrates relative to non-oxidized doped silicon (such as, for example, doped polycrystalline silicon). Further, it is found that appropriate processing conditions will selectively deposit noble metals on BPSG or tantalum oxide (such as, for example, tantalum pentoxide) relative to aluminum oxide ($Al_2O_3$). Additionally, it is found that appropriate processing can provide a rate of deposition which is selective for various different kinds of oxides and doped non-oxidized silicon in the order that the deposition is selective for BPSG relative to thermally-formed silicon dioxide, and selective for both BPSG and thermally-formed silicon dioxide relative to doped non-oxidized silicon.

Methodologies are described herein for incorporating the selectivity of deposition of noble metals on various substrates into semiconductor device fabrication. For instance, methodologies are described herein for forming capacitor constructions associated with semiconductor substrates.

Figure 1:
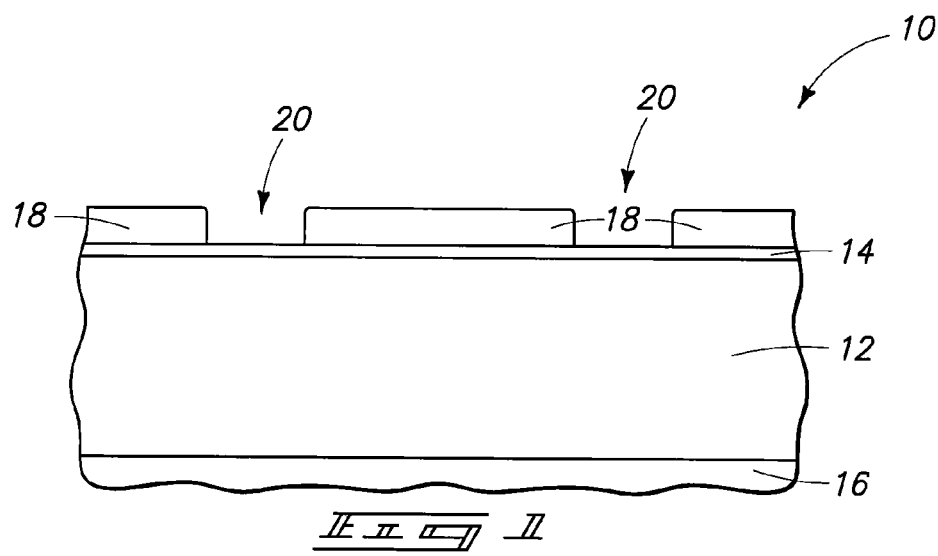
FIG. 1 is a diagrammatic, cross-sectional view of a semiconductor wafer fragment at a preliminary processing stage of an exemplary aspect of the present invention.

An exemplary process of forming capacitor constructions is described with reference to FIGS. 1-5. FIG. 1 shows a fragment 10 of a semiconductor construction at a preliminary processing stage. Fragment 10 includes a layer 12 having a layer 14 thereover. Layers 12 and 14 can alternatively be referred to as masses. For purposes of interpreting this disclosure and the claims that follow, it is to be understood that the term "layer" refers to a single, homogeneous or non-homogenous composition of material.

Layer 12 can comprise, consist essentially of, or consist of, for example, an electrically insulative material. An exemplary material for layer 12 is a composition comprising silicon, oxygen, and at least one of phosphorous and boron; such as, for example, BPSG or phosphosilicate glass (PSG).

Layer 14 comprises, consists essentially of, or consists of a composition different from that of layer 12. Specifically, layer 14 differs from layer 12 in that a noble metal can ultimately be selectively deposited onto layer 12 relative to layer 14. In particular aspects, layer 14 can comprise doped non-oxidized silicon, thermally grown silicon dioxide, and/or aluminum oxide. If layer 14 comprises doped non-oxidized silicon, it can comprise, for example, at least about $1 \times 10^{18}$ atoms/cm$^3$ of dopant. The dopant can be either n-type or p-type, and in particular aspects can comprise, consist essentially of, or consist of phosphorous. The non-oxidized silicon can include one or both of amorphous and polycrystalline silicon.

Layer 12 is shown supported by a structure 16. Structure 16 can comprise, for example, a semiconductive material. An exemplary semiconductive material is single crystal silicon. Structure 16 and/or combinations of structures 16, 12 and 14 can be referred to as a substrate, and in particular aspects as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon, such as, for example, conductive and/or semiconductive materials), and semiconductive material layers (either alone or in assemblies comprising other materials). The term "substrate" refers to any supporting structure, including, but not limited to, the semiconductive/conductive substrates described above.

It is to be understood that the structure 16 can comprise numerous components and devices (not shown) associated with an integrated circuit construction, and formed prior to provision of layers 12 and 14 over structure 16.

A patterned masking material 18 is formed over layer 14. Masking material 18 can comprise, for example, photoresist, and can be patterned into the shown configuration utilizing photolithographic processing. Patterned masking material 18 covers some portions of layer 14, and leaves other portions exposed. Openings 20 extend through masking material 18 to the exposed portions of layer 14.

In the illustrated aspect of the invention, layer 14 is in direct physical contact with layer 12, and the masking material 18 is in direct physical contact with layer 14. It is to be understood, however, that in other aspects there can be intervening materials between layer 12 and layer 14, and/or between layer 14 and masking material 18.

Figure 2:
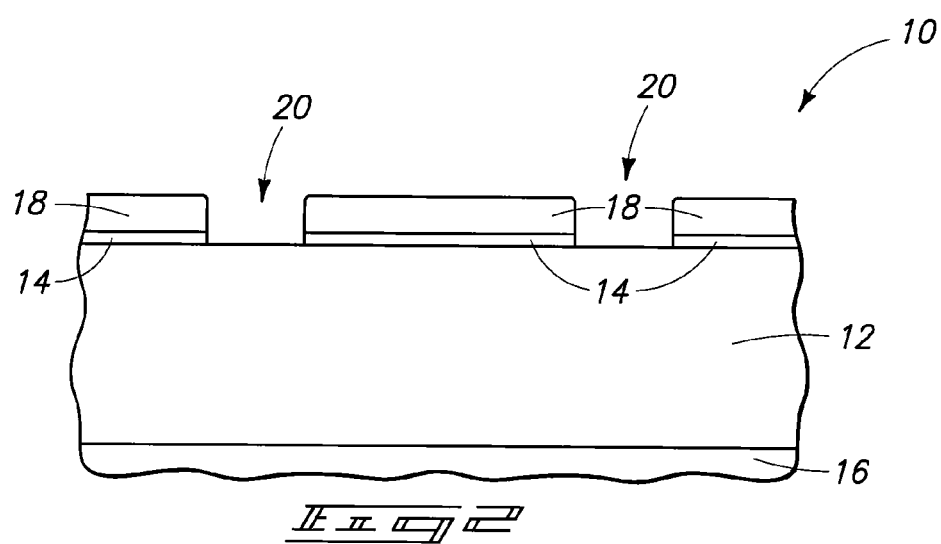
FIG. 2 is a view of the FIG. 1 fragment shown at a processing stage subsequent to that of FIG. 1.

Referring to FIG. 2, openings 20 are extended through layer 14 and to layer 12.

Figure 3:
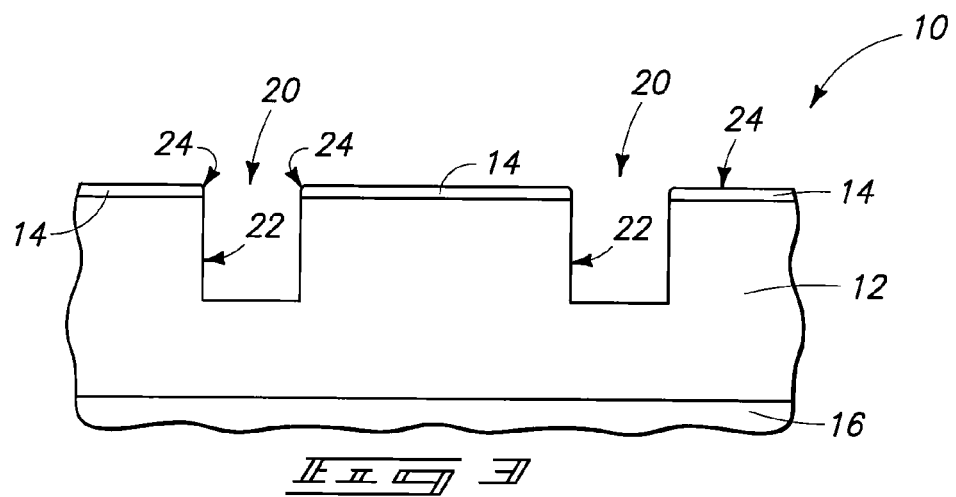
FIG. 3 is a view of the FIG. 1 fragment shown at a processing stage subsequent to that of FIG. 2.

Referring to FIG. 3, openings 20 are extended into layer 12, and masking layer 18 (FIG. 2) is removed. It is noted that the extension of openings 20 through layer 14 and into layer 12 can be accomplished with 2 or more separate etches. Specifically, a first etch can be utilized to extend the openings through layer 14, and a second etch can be utilized to extend the openings into layer 12. Alternatively, a single etch can be utilized for extending the openings through layer 14 and into layer 12. Also, it is noted that in aspects in which two separate etches are utilized, masking material 18 can be removed after the first etch has progressed into or through layer 14, and subsequently the remainder of layer 14 can be utilized as a mask for extending the openings into layer 12.

The construction 10 of FIG. 3 has an outer surface comprising two types of exposed regions. Specifically, a first region 22 corresponds to exposed portions of layer 12 within openings 20, and a second region 24 corresponds to exposed portions of layer 14. The first and second regions can be considered to be first and second materials, respectively, having different compositions relative to one another.

The first and second regions can comprise any of numerous compositions in accordance with various aspects of the invention. For instance, the first region 22 can comprise silicon oxide (such as, for example, silicon dioxide, PSG and/or BPSG) while the second region 24 comprises non-oxidized silicon (which can be, in particular applications! doped to a concentration of at least about $1 \times 10^{18}$ atoms/cm$^3$ with dopant) and/or aluminum oxide.

In other exemplary applications, the first region 22 can comprise tantalum oxide while the second region 24 comprises non-oxidized silicon (which can be, in particular applications, doped to a concentration of at least about $1 \times 10^{18}$ atoms/cm$^3$ with dopant) and/or aluminum oxide. In applications in which the first region 22 comprises tantalum oxide, it can be preferred to form a thin layer of tantalum oxide (not shown) within openings 20, rather than forming an entirety of layer 12 to comprise tantalum oxide. Accordingly, layer 12 can comprise BPSG, and a thin layer of tantalum oxide can be provided as a liner within the openings. The liner can comprise, consist essentially of, or consist of tantalum oxide (such as, for example, tantalum pentoxide).

In particular aspects of the invention, first region 22 can comprise, consist essentially of, or consist of a material comprising silicon, oxygen and one or both of boron and phosphorous (such as, for example, BPSG or PSG), and second region 24 can comprise, consist essentially of, or consist of thermally grown oxide. In such embodiments, layer 14 can initially be provided as non-oxidized silicon, and subsequently can be subjected to thermal processing to convert at least an outer portion of the layer to thermally-formed silicon dioxide.

In applications in which material 14 comprises non-oxidized silicon, it is noted that a thin layer of silicon dioxide (typically referred to as a native oxide layer) can form over the non-oxidized silicon if the non-oxidized silicon is exposed to an oxidizing atmosphere. Accordingly, it can be desired to expose at least a portion of construction 10 to hydrofluoric acid (such as, for example, a solution comprising 100 parts water to about 1 part hydrofluoric acid) to remove native oxide in applications in which it is desired to have region 24 comprise, consist essentially of, or consist of doped non-oxidized silicon. The exposure to hydrofluoric acid can be accomplished utilizing, for example, a hydrofluoric acid dip, or otherwise rinsing an outer portion of construction 10 with hydrofluoric acid. Suitable removal of native oxide can be accomplished with a 2 minute dip in hydrofluoric acid at about room temperature.

Figure 4:
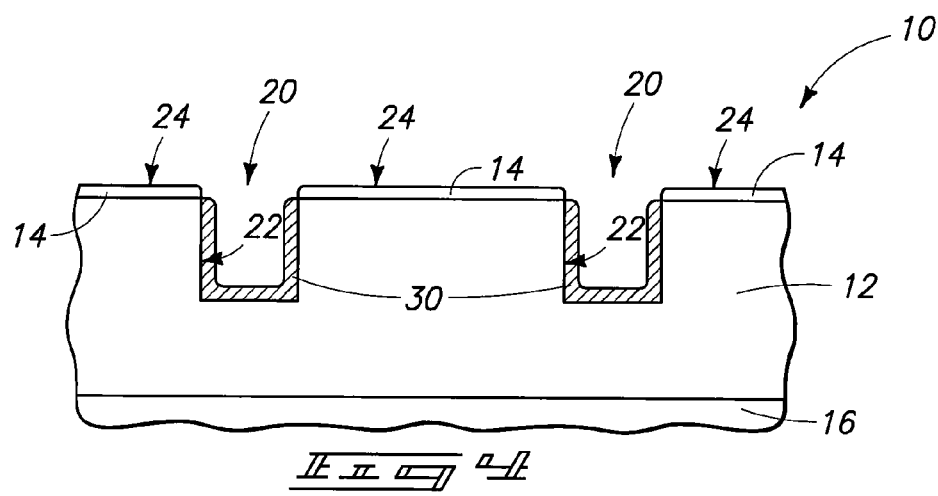
FIG. 4 is a view of the FIG. 1 fragment shown at a processing stage subsequent to that of FIG. 3.

Referring to FIG. 4, a layer 30 comprising, consisting essentially of, or consisting of at least one noble metal is selectively formed on first region 22 relative to second region 24. The at least one noble metal of layer 30 can be selected from the group consisting of platinum, rhodium, palladium, ruthenium and iridium. For purposes of interpreting this disclosure and the claims that follow, it can be useful to distinguish layers 12, 14 and 30 by referring to layers 12, 14 and 30 as a first layer, second layer and third layer, respectively.

The selective formation of layer 30 on first region 22 relative to second region 24 can be accomplished by exposing regions 22 and 24 to a mixture comprising at least one precursor of the at least one noble metal in combination with at least one oxidant. Suitable precursors include organometallic precursors of noble metals, such as, for example, methylcyclopentadienyltrimethylplatinum. Suitable oxidants include molecular oxygen ($O_2$), nitrous oxide ($N_2O$), ozone ($O_3$) and water ($H_2O$).

Exemplary conditions for formation of layer 30 include a transient non-equilibrium chemical vapor deposition process in which at least one noble metal precursor reacts with at least one oxidant to form the layer 30. The transient, non-equilibrium, chemical vapor deposition process occurs in a reaction chamber and differs from a traditional chemical vapor deposition process in that an equilibrium between the noble metal precursor and the oxidant is not achieved during the deposition process.

An exemplary process for achieving the non-equilibrium chemical vapor deposition process is as follows. Initially, at least one noble metal precursor is flowed into the reaction chamber for a time of greater than 0 seconds and typically less than or equal to about 5 seconds (for instance, about 3 seconds). Subsequently, the precursor is partially purged from the reaction chamber by flowing one or more non-reactive purge gases through the chamber for a time of greater than 0 seconds and typically less than or equal to about 5 seconds. The term "non-reactive" is utilized in referring to the purge gases to indicate that the gases do not react with the noble metal precursor or the oxidant. A suitable purge gas can include, for example, one or both of argon and nitrogen. After the partial purge of the at least one precursor from the reaction chamber, at least one oxidant is flowed into the reaction chamber for a time of greater than 0 seconds and typically less than or equal to about 5 seconds (for example, about 2 seconds). Since the one or more noble metal precursors are only partially purged from the reaction chamber prior to flowing the oxidant into the chamber, there is some mixing of the metal precursor(s) with the oxidant during the deposition process. However, the short reaction times are typically not sufficient for equilibrium to develop within the chamber. A suitable temperature within the chamber during the non-equilibrium chemical vapor deposition process is from about 100° C. to about 500° C.

A purge step can follow the introduction of oxidant to flush, or partially flush, the oxidant from the reaction chamber. The purge of the oxidant can utilize a non-reactive purge gas.

While the oxidant and metal precursor(s) are within the chamber, it can be desired that the level of oxidant within the reaction chamber be sufficiently low that reaction between the oxidant and the at least one noble metal precursor is relatively slow. It is found that if too much oxidant is provided in the reaction chamber, the selectivity of the deposition process for layer 22 relative to layer 24 is compromised and/or gas phase reactions occur which generate particles.

In typical processing, the oxidant utilized comprises, consists essentially of or consists of one or more of $O_2$, $O_3$, $H_2O$ and $N_2O$. In an exemplary aspect, the oxidant includes a mixture of both $O_2$ and $N_2O$, with about 2 parts of $N_2O$ being present for every part of $O_2$.

The selectivity accomplished utilizing the processing described above can be very high. For instance, the selectivity for deposition on a region consisting essentially of BPSG and/or tantalum oxide relative to a region consisting essentially of non-oxidized silicon and/or aluminum oxide can be at least 9:1, in particular applications at least 99:1, and in some applications the selectivity is so high that there is no detectable noble metal formed on the second region 24 during the formation of the noble metal on first region 22. The selectivities expressed herein are in terms of the relative thickness of a material formed over region 22 to the thickness of the material formed over region 24. Accordingly, a selectivity of at least about 9:1 indicates that the material formed over region 22 is at least about 9 times thicker than the material formed over region 24, (which can include applications in which there is no material formed over region 24 during the formation of material over region 22). A possible mechanism for the selectivity obtained through processing of the present invention is that there is poor nucleation of noble metals with various compositions relative to others under the processing conditions. Such mechanism is presented to assist the reader in understanding the invention, and is not to limit any claim presented herein unless the mechanism is expressly recited in the claim.

An atomic layer deposition process can be utilized for selectively forming layer 30 on region 22 relative to region 24, rather than the transient non-equilibrium chemical vapor deposition process described above. An atomic layer deposition process would differ from the non-equilibrium chemical vapor deposition process described above in that an atomic layer deposition process would utilize complete purging of the one or more noble metal precursors (or at least substantially complete purging) prior to provision of the oxidant within the reaction chamber. The purging would be complete enough so that there was negligible reaction of unutilized noble metal precursor with oxidant in the chamber. Instead, the at least one noble metal precursor would be utilized without oxidant to form a layer comprising the at least one noble metal along region 22. In typical atomic layer deposition processes, such layer would be a monolayer, or a fraction thereof. Subsequently, residual noble metal precursor would be purged from the reaction chamber, and the layer comprising the at least one noble metal would be exposed to the oxidant to transform the layer into a desired composition comprising, consisting essentially of, or consisting of the at least one noble metal. The oxidant can then be purged in a manner similar to that described above for the purging of the noble metal precursor. The sequence of forming a monolayer comprising at least one noble metal and exposing the monolayer to oxidant can be repeated multiple times to form composition 30 to a desired thickness.

Figure 5:
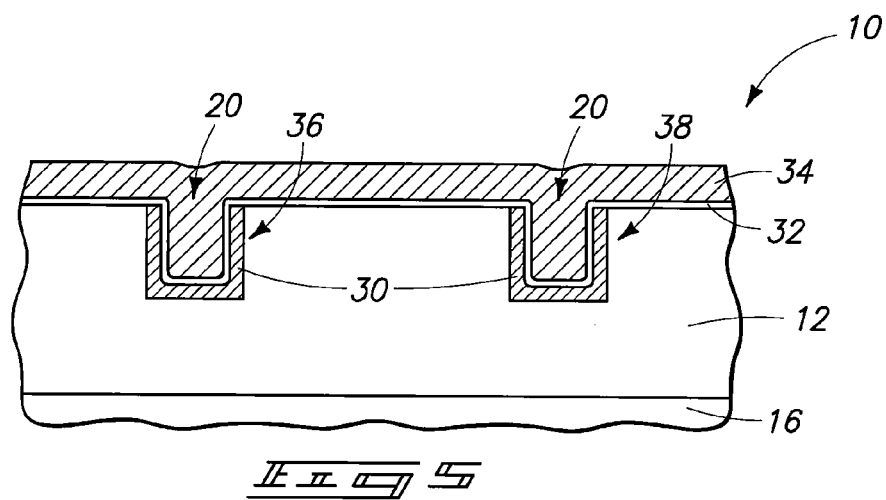
FIG. 5 is a view of the FIG. 1 fragment shown at a processing stage subsequent to that of FIG. 4.

Referring to FIG. 5, first layer 14 (FIG. 4) is removed and subsequently a dielectric material 32 and a conductive material 34 are formed across an upper region of layer 12 and within openings 20. Layer 14 can be removed by, for example, chemical-mechanical polishing.

Dielectric material 32 can comprise any of numerous suitable materials, including, for example, silicon dioxide, silicon nitride, aluminum oxide, hafnium oxide and/or tantalum pentoxide. Conductive material 34 can comprise conductively-doped silicon and/or various metals.

Conductive material 34 is capacitively coupled with the conductive material 30. Accordingly, a pair of capacitor constructions 36 and 38 are defined by layers 30, 32 and 34. The capacitor constructions 36 and 38 can fall within the general class of capacitor constructions known as metal insulator metal (MIM) constructions.

Capacitors 36 and 38 can be incorporated into a DRAM array by electrically coupling the conductive material 30 of each capacitor to a bitline (not shown) through a transistor (not shown).

Figure 6:
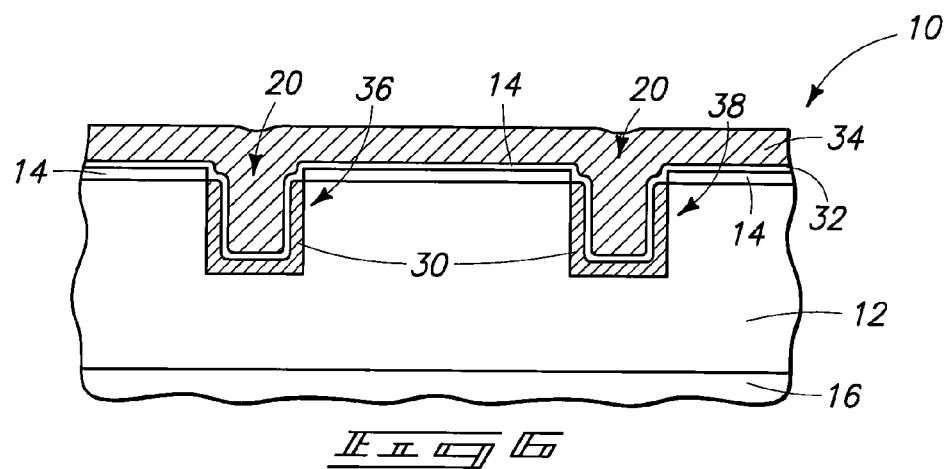
FIG. 6 is a view of the FIG. 1 fragment shown at a processing stage subsequent to that of FIG. 4 in accordance with an aspect of the invention alternative to that described with reference to FIG. 5.

FIG. 6 shows an alternative aspect of the invention relative to that of FIG. 5. Specifically, FIG. 6 shows construction 10 at a processing stage subsequent to that of FIG. 4 in an aspect where the layer 14 has not been removed prior to formation of dielectric material 32 and conductive material 34, and in which layer 14 is not electrically conductive.

FIG. 7 shows construction 10 at a processing step subsequent to that of FIG. 4 in accordance with another aspect of the invention. The layer 30 (FIG. 4) comprising, consisting essentially of, or consisting of at least one noble metal has been exposed to conditions which cause the layer to physically roughen. In the shown embodiment, the roughened layer 30 consists of a plurality of agglomerates 50. The agglomerates can be, for example, discrete, substantially spherical masses.

The conditions utilized for roughening layer 30 comprise exposing the layer to a temperature of at least about 450° C., under an inert atmosphere, for a time of at least about 1 minute. The atmosphere is referred to as an "inert" atmosphere to indicate that it is non-reactive with the noble metal of layer 30. A suitable atmosphere can comprise, consist essentially of, or consist of nitrogen ($N_2$). The temperature utilized during the roughening can, in particular applications, be at least about 500° C., and in some applications can be at least about 700° C. The size of the agglomerates 50 can be controlled through control of various processing conditions, including, for example, temperature and exposure time.

In exemplary applications, the layer 30 utilized to form agglomerates 50 can comprise, consist essentially of, or consist of a single noble metal (such as, for example, one of platinum, iridium, ruthenium, palladium and rhodium), and accordingly agglomerates 50 comprise, consist essentially of, or consist of a single noble metal.

Referring to FIG. 8, construction 10 is exposed to suitable etching conditions for etching into layer 12 while utilizing the agglomerates 50 as a mask. The etching forms cavities 52 extending into region 22. In an exemplary application, agglomerates 50 consist essentially of one or more noble metals, and layer 12 consists essentially of BPSG. Suitable etching conditions can be, for example, substantially selective relative to layer 14 so that the majority of the layer 14 remains after the etching, as shown.

Referring to FIG. 9, agglomerates 50 (FIG. 8) are removed, and subsequently a conductive material 54 is formed over layer 12 and within openings 20. Conductive material 54 extends into cavities 52, and accordingly has more surface area than it would in the absence of the cavities. The additional surface area can be beneficial when layer 54 is incorporated into a capacitor construction because such extra surface area can increase the capacitance of capacitors formed within openings 20 relative to the capacitance of capacitors formed in the absence of cavities 52.

Although conductive material 54 is shown formed over layer 14, it is to be understood that the invention includes other aspects (not shown) in which layer 14 is removed prior to formation of conductive material 54, and accordingly in which conductive material 54 is formed directly on an upper surface of layer 12. Also, although layer 14 is shown as an electrically insulative material, it is to be understood that the invention encompasses applications in which layer 14 is electrically conductive.

Figure 10:
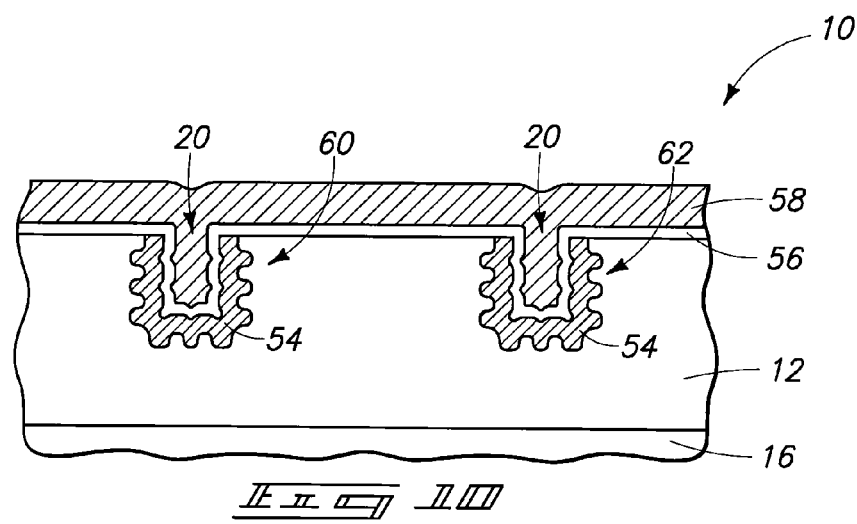
FIG. 10 is a view of the FIG. 7 fragment shown at a processing stage subsequent to that of FIG. 9.

Referring to FIG. 10, layers 14 and 54 are removed from over layer 12, and subsequently a dielectric material 56 and a conductive material 58 are formed across layer 12, as well as within openings 20. The removal of layers 14 and 54 from over layer 12 can be accomplished by, for example, chemical-mechanical polishing. It is noted that although the shown processing removes layer 14, if the layer 14 comprises an insulative material it can remain. Accordingly, the invention encompasses other aspects (not shown) wherein layer 54 is removed from over layer 14 prior to formation of materials 56 and 58, but layer 14 remains. Accordingly, materials 56 and 58 can be formed over layer 14.

Dielectric material 56 and conductive material 58 can comprise the same compositions as discussed above for dielectric material 32 and conductive material 34, respectively, of FIG. 5. Accordingly, conductive material 54 can comprise conductively-doped silicon, and/or metal, and the metal can be in the form of metal nitride and/or in the form of elemental metal.

Layers 54, 56 and 58 together define a pair of capacitor constructions 60 and 62. Such capacitor constructions can be incorporated into a DRAM array by electrically connecting the layer 54 of each capacitor to a transistor (not shown) which is in turn connected to a bitline (not shown).

Figure 11:
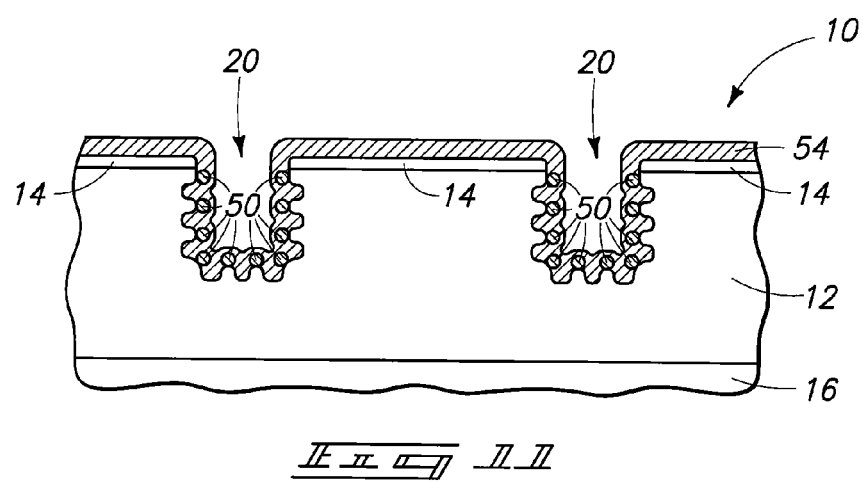
FIG. 11 is a view of the FIG. 1 fragment shown at a processing stage subsequent to that of FIG. 8 in accordance with yet another aspect of the invention.

FIG. 11 illustrates construction 10 at a processing step subsequent to FIG. 8, in accordance with another aspect of the invention. Specifically, FIG. 11 illustrates conductive material 54 formed over layer 14 and within openings 20 while agglomerates 50 remain within the openings. Accordingly, conductive material 54 is provided over agglomerates 50.

Figure 12:
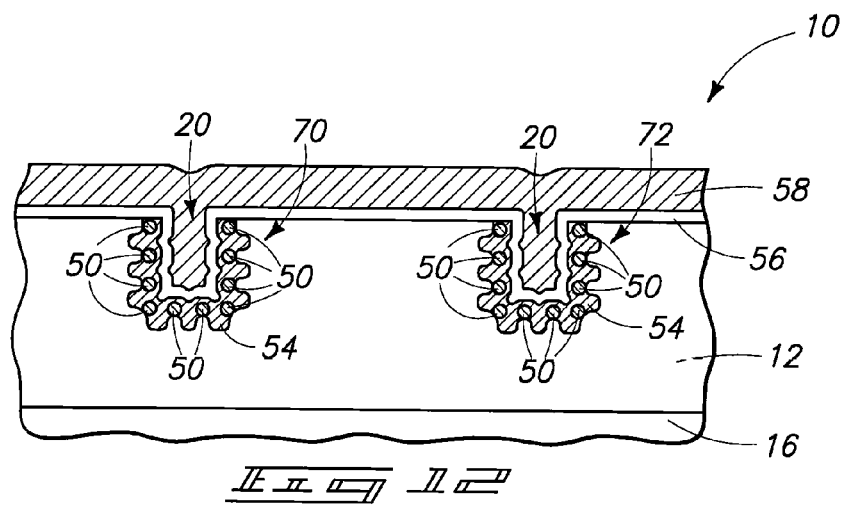
FIG. 12 is a view of the FIG. 11 fragment shown at a processing stage subsequent to that of FIG. 11.

FIG. 12 shows construction 10 at a processing stage subsequent to that of FIG. 11. Specifically, layer 14 has been removed, and layers 56 and 58 have been formed over layer 12 and within openings 20. Layers 56 and 58 comprise a dielectric material and conductive material, as discussed above with reference to FIG. 10. The layers 56 and 58 can be considered to extend into regions 20 contained within layer 12.

A pair of capacitor constructions 70 and 72 are formed from layers 54, 56 and 58. The capacitor constructions can be incorporated into DRAM or other memory arrays associated with integrated circuitry. For instance, the capacitor constructions can each be electrically connected to a bitline (not shown) through a transistor construction (not shown) to incorporate the capacitors into a DRAM array.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a monocrystalline silicon substrate;

a silicon-dioxide-comprising material over the substrate; and spaced islands of noble-metal-containing agglomerates in direct physical contact with the silicon-dioxide-comprising material.

2. A semiconductor construction, comprising:

a monocrystalline silicon substrate;

a silicon-dioxide-comprising material over the substrate;

spaced islands of noble-metal-containing agglomerates in direct physical contact with the silicon-dioxide-comprising material;

a first conductive layer extending over the agglomerates;

a dielectric layer over the first conductive layer; and a second conductive layer over the dielectric layer; the second conductive layer being capacitively coupled with the first conductive layer.

3. A semiconductor construction, comprising:

a monocrystalline silicon substrate;

borophosphosilicate glass over the substrate; and spaced islands of noble-metal-containing agglomerates in direct physical contact with the borophosphosilicate glass.

4. The semiconductor construction of claim 3 wherein the noble-metal-containing agglomerates comprise at least one of Pt, Rh, Ru, Pd and Ir.

* * * * *